METHOD OF MAKING SEMICONDUCTOR DEVICE

Original Filed June 21, 1968 2 Sheets-Sheet 1

Inventor:
Reinhold Kaiser
By: Spencer & Kaye
Attorneys

Sept. 4, 1973 R. KAISER 3,756,873

METHOD OF MAKING SEMICONDUCTOR DEVICE

Original Filed June 21, 1968 2 Sheets-Sheet 2

Inventor:
Reinhold Kaiser
By: Spencer & Kaye
Attorneys

United States Patent Office 3,756,873
Patented Sept. 4, 1973

3,756,873

METHOD OF MAKING A SEMICONDUCTOR DEVICE

Reinhold Kaiser, Heilbronn, Neckar, Germany, assignor to Telefunken Patentverwertungsgesellschaft m.b.H., Ulm (Danube), Germany Original appplication June 21, 1968, Ser. No. 738,908. Divided and this application Mar. 12, 1970, Ser. No. 18,928

Claims priority, application Germany, June 22, 1967, T 34,151

Int. Cl. H01l 7/34

U.S. Cl. 148—187 4 Claims

ABSTRACT OF THE DISCLOSURE

A transistor having an emitter zone and a collector zone separated by a base zone, and a method of making the same. The region of the collector zone adjacent to the base zone and opposite the emitter zone is of lower resistance than the remainder of the collector zone. The method of forming the transistor entails opening a diffusion window of the size and location of an emitter diffusion window in a diffusion masking layer formed on the surface of a semiconductor body of a first conductivity type, and forming a low-ohmic region of the first conductivity within the semiconductor body by the diffusion of an impurity. The base diffusion window is then opened and the base zone formed by diffusion so that the base zone extends to a lesser depth from the surface of the semiconductor body than the low ohmic region, and finally the emitter diffusion window is opened at the location and of the size of the first opened diffusion window and an emitter zone is formed by diffusion in the base zone.

CROSS-REFERENCE TO RELATED APPLICATION

This application is a division of copending application Ser. No. 738,908, filed June 21, 1968, now abandoned.

BACKGROUND OF THE INVENTION

The present invention relates to a semiconductor device having an emitter zone and a collector zone separated by a base zone.

More particularly, the present invention relates to an improved transistor structure and a method for making the same.

SUMMARY OF THE INVENTION

An object of the present invention is to produce a transistor which, in spite of its low collector capacitance, can be operated with a high collector current.

An additional object of the present invention is to produce a transistor with a reduced base resistance by eliminating at least most of the bulge of the base zone caused by the so-called "emitted dip effect."

These, as well as other objects which will become apparent in the discussion that follows, are achieved, according to the present invention, by making the region of the transistor collector zone which is adjacent to the base zone and opposite the emitter zone of lower resistance than the remainder of the collector zone. The low-ohmic region in the collector zone is obtained by projection of the emitter zone into the collector zone.

In order to obtain a low collector capacitance, the portion of the remainder of the collector zone which borders the low-ohmic region thereof should be made as high ohmic as possible, at least in the region adjacent the base zone.

The conductivity of the low-ohmic region of the collector zone is preferably made at least five times greater than the remaining region of the collector zone. In transistors having a plurality of emitter zones the collector zone is preferably provided with a low-ohmic region adjacent to the base zone at points opposite each of the emitter zones.

The low-ohmic region in the collector zone, according to the present invention, can be produced in a planar transistor, for example, according to the following method: a diffusion inhibiting masking layer is first applied to the planar surface of a semiconductor body and provided with a first window exposing the semiconductor surface. The low-ohmic region having the same conductivity type as the collector zone is then diffused into the semiconductor body through this window. A base zone is next diffused through a base diffusion window formed in the diffusion inhibiting layer. The base zone is allowed to extend in the semiconductor body to a depth which is less than the depth of the low-ohmic region. The diffusion inhibiting layer is finally provided with an emitter diffusion window the same size and at the same position as the first diffusion window and the emitter zone is diffused therethrough into the semiconductor body in the region on the opposite side of the base zone to the low-ohmic region in the collector zone.

DESCRIPTION OF THE PREFERRED EMBODIMENTS

Figure 1:
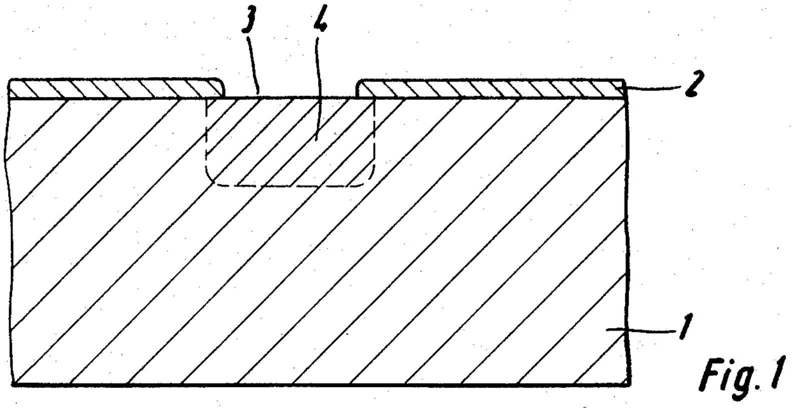
FIG. 1 is a cross-sectional view of the transistor of FIG. 3 in an initial stage of manufacture, according to the method of the present invention.
Figure 2:
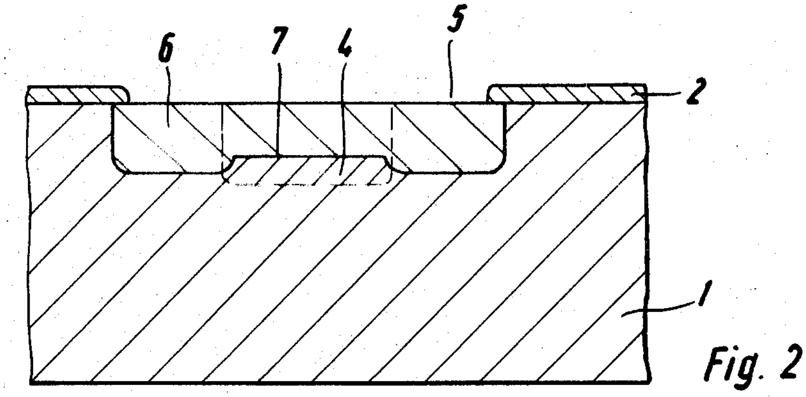
FIG. 2 is a cross-sectional view of the transistor of FIG. 3 in a subsequent stage of manufacture, according to the method of the present invention.
Figure 3:
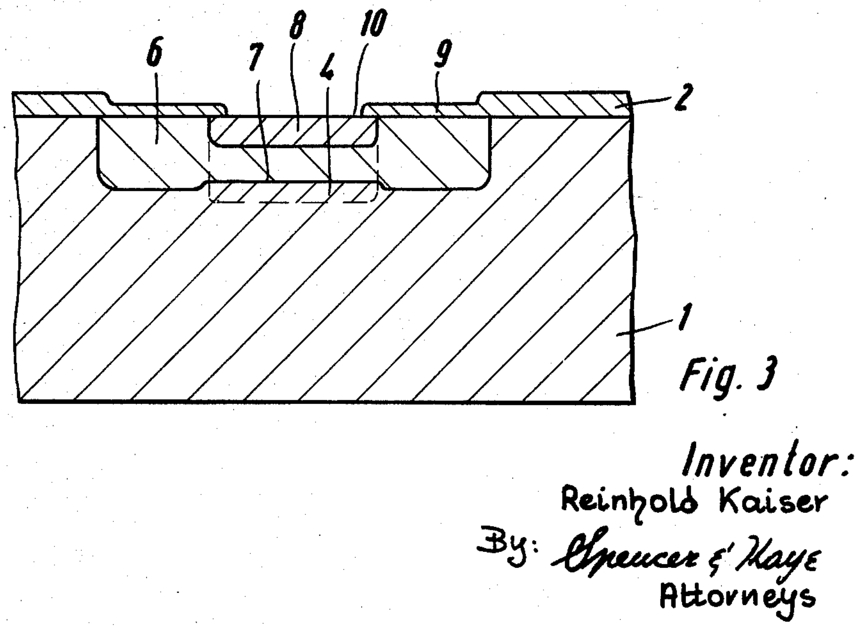
FIG. 3 is a cross-sectional view of the transistor according to the present invention.

Referring now to the drawings, FIGS. 1, 2 and 3 illustrate the preferred method of manufacturing a planar transistor according to the present invention. The manufacturing process is begun, as shown in FIG. 1, with a semiconductor body 1 having the conductivity type of the collector zone. The conductivity of this semiconductor body may, for example, equal 0.1 ohm$^{-1}$ cm.$^{-1}$. A diffusion inhibiting layer 2, for example of silicon dioxide or silicon nitride, is then applied to the surface of this semiconductor body 1.

Into the diffusion inhibiting layer 2 is etched a diffusion window 3 as shown in FIG. 1; the size of this window 3 is made equal to the size of the window which will later be used in the diffusion of the emitter zone. A low-ohmic region 4 having the same conductivity type as the collector zone is then diffused through the diffusion window 3 into the semiconductor body 1. This region 4 is diffused to a depth in the semiconductor body which is greater than the depth to which the subsequently added base zone will extend. The conductivity of this low-ohmic region may, for example, be made equal to 0.5 ohm$^{-1}$ cm.$^{-1}$ at the depth at which the base-collector pn-junction will ultimately lie.

After the low-ohmic collector region 4 is formed, the window in the diffusion inhibiting layer 2 is enlarged by etching, as shown in FIG. 2, to form a base diffusion window 5. The base zone 6 is then diffused through this window 5 into the semiconductor body. As may be seen in FIG. 2, the base diffusion is not carried out to as great a depth as the diffusion of the low-ohmic region so that a portion of the low-ohmic region 4 is allowed to remain in the collector zone.

Because of the superposition of the base zone 6 and the low-ohmic region 4 having the conductivity type of the collector zone, the base zone will be formed with an indentation 7 above the low-ohmic region 4. As may be seen in FIG. 3, however, the size of this indentation will be reduced to a certain extent as the result of the "emitter dip effect" when the emitter zone is formed.

To produce the emitter zone 8 after the base diffusion is completed, the semiconductor body surface is covered with a new diffusion inhibiting layer 9. An emitter diffusion window 10 is then etched into this layer 9 and the emitter zone 8 diffused therethrough into the semiconductor body, completing the semiconductor portion of the transistor.

The low-ohmic region 4 in the collector zone 1 of the planar transistor shown in FIG. 3 makes it possible to operate the transistor with a higher collector current than would be possible without this low-ohmic region. Whereas, because of the emitter dip effect, the transistors of the prior art produced by diffusion exhibit a bulge in the base zone in the direction of the collector zone, the low-ohmic region 4 causes the base zone 6 of the planar transistor of FIG. 3 to have an indentation 7 directed toward the emitter side. This indentation effects a reduction of the base resistance of the transistor of FIG. 3, compared to the transistors of the prior art which exhibit the base zone bulge.

Figure 4:
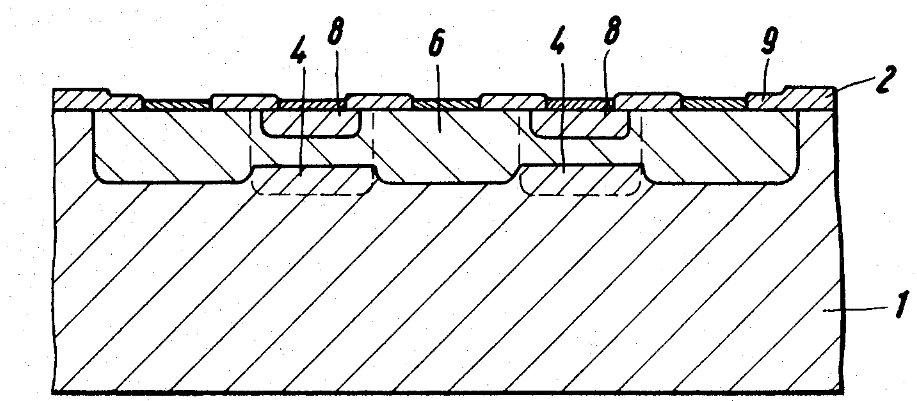
FIG. 4 is a cross-section view of a transistor according to the present inventoin having a plurality of emitter zones.

FIG. 4 illustrates still another transistor having a number of emitter zones 8. According to a preferred embodiment of the present invention, a low-ohmic region 4 is provided in the collector zone 1 opposite each individual emitter zone 8.

In both the transistor with a single emitter and the transistor with a plurality of emitters, the low-ohmic region 4 can be made to extend to any desired depth in the collector zone since the barrier resistance of the collector is reduced by the low-ohmic regions. In general, however, practical difficulties may arise if the low-ohmic region 4 is diffused throughout the entire depth of the semiconductor body.

It will be understood that the above description of the present invention is susceptible to various modifications, changes and adaptations, and the same are intended to be comprehended within the meaning and range of equivalents of the appended claims.

I claim:

1. In a method of making a planar transistor, the improvement comprising the steps of:

(a) applying a masking layer to one surface of a semiconductor body having a first conductivity type and which forms a collector zone;

(b) removing a portion of said masking layer to provide a first diffusion window exposing the surface of said semiconductor body;

(c) diffusing a low-ohmic region through said first window into said collector zone, said region having the conductivity type of said collector zone and a greater conductivity than that of said collector zone;

(d) diffusing a base zone through a base diffusion window into said semiconductor body, said base zone extending to a depth which is less than the depth of said low-ohmic region;

(e) diffusing an emitter zone through an emitter diffusion window the size of said first diffusion window into said semiconductor body, said emitter zone being opposite said low-ohmic region.

2. A method as defined in claim 1 wherein the first diffusion window is provided in the masking layer at the same location along the surface of the semiconductor body as the emitter diffusion window.

3. In a method of making a planar transistor, the improvement comprising the steps of:

applying a diffusion masking layer to one surface of a semiconductor body of a first conductivity type and which forms a collector zone;

opening a first diffusion window in said masking layer of the size and location of an emitter diffusion window;

diffusing a low-ohmic region of said first conductivity type and having a greater conductivity than that of the collector zone into the collector zone via said first diffusion window to a depth from said surface which is greater than the desired depth of the base zone of the transistor being made;

opening a base diffusion window in said masking layer to expose the underlying portion of said surface of the semiconductor body containing said low-ohmic region;

diffusing a base zone of the opposite conductivity type into said semiconductor body, via said base diffusion window, to a maximum depth from said surface which is less than the depth of said low-ohmic region;

closing said base diffusion window and opening an emitter diffusing window of the same size and at the same location as said first diffusion window; and diffusing an emitter zone into the base zone of said semiconductor body via said emitter diffusion window.

4. The method defined in claim 3 wherein said step of diffusing a low-ohmic region is carried out so that the conductivity thereof at the desired depth of the base-collector junction is at least five times greater than the conductivity of the semiconductor body.

References Cited

UNITED STATES PATENTS

| | | | |
|---|---|---|---|
| 3,312,881 | 4/1967 | Yu | 317—235 |
| 3,477,886 | 11/1969 | Ehlenberger | 148—187 |
| 2,802,760 | 8/1957 | Derick et al. | 148—187 X |
| 3,397,449 | 8/1968 | Jenny | 148—187 X |
| 3,408,238 | 10/1968 | Sanders | 148—187 |
| 3,484,309 | 12/1969 | Gilbert | 148—33.5 |

L. DEWAYNE RUTLEDGE, Primary Examiner

J. M. DAVIS, Assistant Examiner

U.S. Cl. X.R.

317—235 R